United States Patent
Omori et al.

(10) Patent No.: US 7,540,003 B2
(45) Date of Patent: May 26, 2009

(54) OPTICAL PICKUP DEVICE, DISK DRIVE UNIT, AND DISK DRIVE DEVICE

(75) Inventors: Kiyoshi Omori, Tokyo (JP); Satoshi Muto, Chiba (JP)

(73) Assignee: Sony Corporation, Tokyo (JP)

( * ) Notice: Subject to any disclaimer, the term of this patent is extended or adjusted under 35 U.S.C. 154(b) by 517 days.

(21) Appl. No.: 10/548,837

(22) PCT Filed: Feb. 21, 2005

(86) PCT No.: PCT/JP2005/002709

§ 371 (c)(1),
(2), (4) Date: Sep. 13, 2005

(87) PCT Pub. No.: WO2005/081234

PCT Pub. Date: Sep. 1, 2005

(65) Prior Publication Data

US 2006/0198253 A1    Sep. 7, 2006

(30) Foreign Application Priority Data

Feb. 19, 2004    (JP) .............................. 2004-043370

(51) Int. Cl.
*G11B 17/03* (2006.01)
(52) U.S. Cl. ..................................... 720/653
(58) Field of Classification Search ................ 720/653, 720/601, 613, 647; 360/97.01; 369/75.1
See application file for complete search history.

(56) References Cited

U.S. PATENT DOCUMENTS

| | | | | |
|---|---|---|---|---|
| 5,859,746 A | * | 1/1999 | Ishida et al. | 360/97.01 |
| 5,892,747 A | * | 4/1999 | Okada et al. | 720/647 |
| 6,151,284 A | * | 11/2000 | Watanabe et al. | 720/601 |
| 7,185,346 B2 | * | 2/2007 | Watanabe et al. | 720/613 |
| 2001/0012255 A1 | * | 8/2001 | Furukawa et al. | 369/75.1 |

FOREIGN PATENT DOCUMENTS

| | | |
|---|---|---|
| JP | 3-44884 | 2/1991 |
| JP | 4-30374 | 2/1992 |
| JP | 7-37662 | 2/1995 |
| JP | 11-273270 | 10/1999 |
| JP | 11273270 A * | 10/1999 |
| JP | 2001-126464 | 5/2001 |
| JP | 2003-22713 | 1/2003 |

* cited by examiner

*Primary Examiner*—Tianjie Chen
(74) *Attorney, Agent, or Firm*—Oblon, Spivak, McClelland, Maier & Neustadt, P.C.

(57) ABSTRACT

The present invention is directed to an optical pick-up apparatus used for recording/reproduction of an optical disk, which comprises an optical pick-up (17) caused to undergo feed operation in the radial direction of optical disk (2), and for performing write or read operation of information signals with respect to the rotating optical disk, and a flexible printed wiring board (45) having one end portion (45a) connected to the optical pick-up, and the other end portion (45d) provided in a manner extended in the feed direction of the optical pick-up. The flexible printed wiring board includes a folded portion (45g) folded back toward the bottom surface portion side of the optical pick-up, and a bending displacement portion (45h) for allowing folded position of the folded portion to undergo displacement in a manner following the feed operation of the optical pick-up, wherein a slit (47) for escaping a projected portion (17b) projected from the bottom surface portion of the optical pick-up is provided at the folded portion.

13 Claims, 13 Drawing Sheets

OPTICAL PICKUP DEVICE, DISK DRIVE UNIT, AND DISK DRIVE DEVICE

TECHNICAL FIELD

The present invention relates to an optical pick-up device and a disk drive unit using such an optical pick-up device, and further relates to a disk drive apparatus. Moreover, the present invention relates to an optical pick-up device to which flexible wiring printed board (hereinafter referred to as FPC) is connected in order to perform transmission/reception of signals and a disk drive unit using such an optical pick-up device, and further relates to a disk drive apparatus.

This Application claims priority of Japanese Patent Application No. 2004-043370, field on Feb. 19, 2004, the entirety of which is incorporated by reference herein.

BACKGROUND ART

Hitherto, optical disks such as CD (Compact Disk) or DVD (Digital Versatile Disk) have been used as recording media for information signals, and various disk drive apparatuses using these optical disks as recording media have been used.

As a disk drive apparatus using optical disk as recording medium of this kind, there is known a disk drive apparatus comprising a disk drive unit 200 constituted as shown in FIG. 1.

The disk drive unit 200 shown in FIG. 1 comprises a disk rotation drive mechanism 201 for rotationally driving an optical disk, an optical pick-up 202 for performing write or read operation of signals with respect to the optical disk rotationally driven by the disk rotation drive mechanism 201, a pick-up feed mechanism 203 for performing feed operation of the optical pick-up 202 in the radial direction of the optical disc, a FPC 204 having one end portion connected to the optical pick-up 202 and the other end provided in a manner extended in feed direction of the pick-up 202, and a circuit wiring board 206 on which a connector 205 to which the other end portion of the FPC 204 is connected is provided. These respective mechanisms and components are attached to a base 207.

The disk rotation drive mechanism 201 includes a flat spindle motor 209 at which a turn table 208 for holding the optical disk is provided, wherein the spindle motor 209 is supported by the circuit wiring board 206, and rotationally drives the optical disk in one body with the turn table 208.

The optical pick-up 202 converges light beams which have been emitted from semiconductor laser by an object lens 210 to irradiate the light beams thus converged onto the signal recording surface of the optical disk to detect, by light receiving element, return light beams which have been reflected on the signal recording surface of the optical disk to thereby perform write or read operation of signals with respect to the optical disk.

The pick-up feed mechanism 203 includes a pair of guide shafts 211a, 211b for movably supporting the optical pick-up 202 in the radial direction of the optical disk, a rack member 212 attached to the optical pick-up 202, a lead screw 213 meshed with the rack member 212, and a stepping motor 214 for rotationally driving the lead screw 213, wherein the stepping motor 214 performs movement operation of the rack member 212 which has been meshed with the lead screw 213 in the radial direction of the optical disk along with the optical pick-up 202 while rotationally driving the lead screw 213.

The FPC 204 includes a folded portion 204a folded back toward the bottom surface portion side of the optical pick-up 202, and a bending displacement portion 204b for allowing folded position of the folded portion 204a to undergo displacement in a manner following feed operation of the optical pick-up 202, and is drawn around between the optical pick-up 202 and the circuit wiring board 206.

The circuit wiring board 206 is the so-called rigid board, and is adapted so that a connector 205 to which the other end portion of the above-described FPC 204 is connected, a connector 215 for performing electric connection to other circuit wiring board or boards provided at the drive body side, and drive control circuits for performing drive control operations of respective units (components), etc. are mounted thereon.

The base 207 is comprised of sheet metal punched so as to have a predetermined shape, wherein an opening portion 216a for table to which the turn table 208 is faced and an opening portion 216b for pick-up to which the optical pick-up 202 is faced are continuously formed on the principal surface thereof. At the principal surface of the side opposite to the principal surface of the side where the turn table 208 and the optical pick-up 202 are faced from these opening portions 215a, 215b, there are attached the circuit wiring board 206, both end portions of a pair of guide shafts 211a, 211b, the lead screw 213 and the stepping motor 214 which have been described above, etc.

At the disc drive unit 200 constituted as described above, the disk rotation drive mechanism 201 rotationally drives the optical disk, and while the pick-up feed mechanism 203 is performing feed operation of the optical pick-up 202 in the radial direction of the optical disc, the optical pick-up 202 performs write or read operation of signals with respect to the optical disk.

Meanwhile, the above-described disk drive unit 200 is mounted at a disk drive apparatus 300 of the very thin type shown in FIG. 2. The disk drive unit 200 is attached integrally with a disk tray 302 which is taken out from a casing or housing 301 of the disk drive apparatus 300 and is inserted thereinto in a horizontal direction.

Since such disc drive apparatus 300 of the very thin type is mounted at thin type information processing equipment, e.g., note-type personal computer, etc., the disc drive apparatus 300 undergoes various restrictions in thickness direction. In concrete terms, at the disk drive apparatus 300, spacing between the bottom surface portion of the optical pick-up 202 mounted at the disk drive unit 200 and the casing 301 becomes very narrow.

At the optical pick-up 202, as described above, there are mounted semiconductor laser, light receiving element, various optical parts (components) for guiding light beams which have been emitted from the semiconductor laser onto optical disk, and for guiding return light beams which have been reflected on the optical disk into the light receiving element, and/or biaxial actuator for performing displacement drive of the object lens 210 in a focusing direction and in a tracking direction, etc.

However, at the optical pick-up 202, while it is necessary to suppress the thickness of the entirety as minimum as possible, it is difficult to thin each thickness of parts (components) mounted thereat depending upon the kind thereof. Particularly, in the case where the disk drive apparatus 300 is caused to be of thin structute to such a degree that its thickness becomes equal to about 9.5 mm which is thickness equal to that of the Hard Disk Drive (HDD) unit, since there hardly exists portion for reducing size in thickness direction, e.g., liquid crystal device for correcting aberration mounted at the optical pick-up 202 is disposed in a manner projected from the bottom surface portion of the optical pick-up 202.

In this case, as shown in FIG. 2, a projected portion 202a of the liquid crystal device, which is projected from the bottom surface portion of the optical pick-up 202, comes into contact with the folded portion 204a of the FPC 204 folded back toward the bottom surface portion side of the optical pick-up 202.

For this reason, at the disk drive apparatus 300, when feed operation of the optical pickup 202 is performed in the radial direction of the optical disk D, the projected portion 202a comes into slidably contact with the FPC 204 to damage wirings formed at the FPC 204, or to give bad influence or effect on signals delivered to such wirings.

Moreover, at the disk drive apparatus 300, when spacing between the bottom surface portion of the optical pick-up 202 mounted at the disk drive unit 200 and the casing 301 becomes narrow, draw-around space of the FPC 204 which is draw around between the optical pick-up 202 and the circuit wiring board 206 also becomes narrow. In this case, at the bending displacement portion 204b corresponding to folded position of the FPC 204, since the radius of curvature becomes small, its elastic (spring) force is also increased.

For this reason, at the disk drive apparatus 300, there was the problem that load by elastic force of the FPC 204 is applied to the optical pick-up 202 so that bad influence is given on feed operation of the optical pick-up 202.

Particularly, at recent disk drive apparatus 300, there is mounted optical pick-up 202 capable of performing recording/reproduction of information signals with compatibility with respect to recording formats of different disks such as CD and DVD. In order to comply with such situation, also at the FPC 204, signal lines for performing drive control of the optical pick-up 202 with different recording formats are wired. For this reason, at the disk drive apparatus 300, the number of wirings of the FPC 204 is increased and the FPC 204 is thus broaden so that load applied from the above-described bent FPC 204 to the optical pickup 202 is also increased.

For reference, as an optical pick-up apparatus in which the entirety of the apparatus is caused to be of thin structure, there is an optical pick-up apparatus disclosed in the Japanese Patent Application Laid Open No. 2001-325740 publication. In the optical pick-up apparatus described in this publication, composite (compound) chip of semiconductor laser and light receiving element is directly plane-mounted with respect to wiring board frame comprised of metallic wiring board to thereby realize the thin structure of the entirety of the apparatus.

In addition, as a disk drive apparatus in which the influence with respect to vibration-proof leg by spring action of FPC has been suppressed, there is a disk drive apparatus disclosed in the Japanese Patent Application Laid Open No. 2001-229659 publication. In the disk drive apparatus disclosed in this publication, the FPC which connects between the unit mechanism supported by the vibration-proof leg and the control board is divided into two parts to dispose the portion at the connecting position to the unit mechanism in a manner substantially symmetrical with respect to the center of gravity of the unit mechanism to thereby suppress influence with respect to the vibration-proof leg by spring action of FPC.

DISCLOSURE OF THE INVENTION

Problems to be Solved by the Invention

An object of the present invention is to provide a novel optical pick-up device which can eliminate or solve problems that the prior arts have, a disk drive unit using such an optical pick-up device, and a disk drive apparatus.

Another object of the present invention is to provide an optical pick-up device in which even in the case where further thin structure is realized, load applied from bent flexible printed wiring board is lessened to have ability to perform stable feed operation, a disk drive unit using such an optical pick-up device, and a disk drive apparatus.

The optical pick-up device according to the present invention proposed in order to solve problems as described comprises: an optical pick-up caused to undergo feed operation in a radial direction of an optical disk, and for performing write and/or read operations of signals with respect to the rotating optical disk; and a flexible printed wiring board having one end portion connected to the optical pick-up and the other end portion provided in a manner extended in a feed direction of the pick-up, the flexible printed wiring board including a folded portion folded back toward the bottom surface portion side of the optical pick-up, and a bending displacement portion for allowing folded position of the folded portion to undergo displacement in a manner following the feed operation of the optical pick-up, an opening portion for escaping a projected portion projected from the bottom surface portion of the optical pick-up being provided at the folded portion.

Moreover, the optical pick-up device according to the present invention comprises: an optical pick-up caused to undergo feed operation in a radial direction of an optical disk, and for performing write and/or read operations of signals with respect to the rotating optical disk; and a flexible printed wiring board having one end portion connected to the optical pick-up and the other end portion provided in a manner extended in a feed direction of the pick-up, the flexible printed wiring board including a folded portion folded back toward the bottom surface portion side of the optical pick-up, and a bending displacement portion for allowing folded position of the folded portion to undergo displacement in a manner following the feed operation of the optical pick-up, the bending displacement portion being divided into plural wiring portions arranged in a direction substantially perpendicular to feed direction of the optical pick-up.

The disk drive unit according to the present invention comprises: a disk loading portion adapted so that an optical disk is loaded; a disk rotation drive mechanism for rotationally driving the optical disk which has been loaded at the disk loading portion; an optical pick-up for performing write and/or read operations of signals with respect to the optical disk rotationally driven by the disk rotation drive mechanism: a pick-up feed mechanism for allowing the optical pick-up to undergo feed operation thereof in a radial direction of the optical disk; and a flexible printed wiring board having one end portion connected to the optical pick-up, and the other end portion provided in a manner extended in a feed direction of the pick-up, the flexible printed wiring board including a folded portion folded back toward the bottom surface portion side of the optical pick-up, and a bending displacement portion for allowing folded position of the folded portion to undergo displacement in a manner following the feed operation of the optical pick-up by the pick-up feed mechanism, an opening portion for escaping a projected portion projected from the bottom surface portion of the optical pick-up being provided at the folded portion.

The disk drive unit according to the present invention comprises: a disk loading portion adapted so that an optical disk is loaded; a disk rotation drive mechanism for rotationally driving the optical disk which has been loaded at the disk loading portion; an optical pick-up for performing write and/or read operations of signals with respect to the optical disk rotationally driven by the disk rotation drive mechanism; a pick-up feed mechanism for allowing the optical pick-up to undergo feed operation thereof in a radial direction of the optical disk; and a flexible printed wiring board having one end portion connected to the optical pick-up, and the other end portion provided in a manner extended in a feed direction of the pickup, the flexible printed wiring board including a folded portion folded back toward the bottom surface portion side of the optical pick-up, and a bending displacement portion for allowing folded position of the folded portion to undergo displacement in a manner following feed operation of the optical pick-up by the pick-up feed mechanism, the bending displacement portion being divided into plural wiring portions arranged in a direction substantially perpendicular to the feed direction of the optical pick-up.

The disk drive apparatus according to the present invention comprises: a casing; and a disk drive unit accommodated within the casing, the disk drive unit comprising a disk loading portion adapted so that an optical disk is loaded, a disk rotation drive mechanism for rotationally driving the opticasl disk which has been loaded at the disk loading portion, an optical pick-up for performing write and/or read operations of signals with respect to the optical disk rotationally driven by the disk rotation drive mechanism, a pick-up feed mechanism for allowing the optical pick-up to undergo feed operation thereof in a radial direction of the optical disk, and a flexible printed wiring board having one end portion connected to the optical pick-up and the other end portion provided in a manner extended in a feed direction of the pick-up, the flexible printed wiring board including a folded portion folded back toward the bottom surface portion side of the optical pick-up, and a bending displacement portion for allowing folded position of the folded portion to undergo displacement in a manner following the feed operation of the optical pick-up by the pick-up feed mechanism, an opening portion for escaping a projected portion projected from the bottom surface portion of the optical pick-up being provided at the folded portion.

The disk drive apparatus according to the present invention comprises: a casing; and a disk drive unit accommodated within the casing, the disk drive unit comprising a disk loading portion adapted so that an optical disk is loaded, a disk rotation drive mechanism for rotationally driving the optical disk which has been loaded at the disk loading portion, an optical pick-up for performing write and/or read operations of signals with respect to the optical disk rotationally driven by the disk rotation drive mechanism, a pick-up feed mechanism for allowing the optical pick-up to undergo feed operation thereof in a radial direction of the optical disk, and a flexible printed wiring board having one end portion connected to the optical pick-up, and the other end portion provided in a manner extended in a feed direction of the pick-up, the flexible printed wiring board including a folded portion folded back toward the bottom surface portion side of the optical pick-up, and a bending displacement portion for allowing folded position of the folded portion to undergo displacement in a manner following the feed operation of the optical pick-up by the pick-up feed mechanism, the bending displacement portion being divided into plural wiring portions arranged in a direction substantially perpendicular to feed direction of the optical pick-up.

In the optical pick-up device to which the present invention is applied, opening portion is provided at folded portion of the flexible printed wiring board folded back toward the bottom surface portion side, and the projected portion projected from the bottom surface portion of the optical pick-up is escaped from the opening portion, thereby making it possible to avoid contact between the projected portion and the flexible printed wiring board. Thus, the spacing between the bottom surface portion of the optical pick-up and the casing or housing is narrowed, thus making it possible to realize further thin structure.

In addition, the present invention is applied to thereby divide the bending displacement portion corresponding to folded position of the flexible printed wiring board into plural wiring portions arranged in a direction substantially perpendicular to feed direction of the optical pick-up, thereby making it possible to lessen load applied to the optical pick-up from bent flexible printed wiring board. Further, even in the case where draw-around space of the flexible printed wiring board is narrowed by realization of thin structure of the device, load applied to the optical pick-up from bent flexible printed wiring board is lessened, thereby making it possible to realize stable and precise feed operation of the optical pick-up.

Still further objects of the present invention and practical merits obtained by the present invention will become more apparent from the embodiments which will be given below with reference to the attached drawings.

BEST MODE FOR CARRYING OUT THE INVENTION

An optical pick-up device, a disk drive unit and a disk drive apparatus to which the present invention is applied will now be described in detail with reference to the attached drawings.

Figure 1:
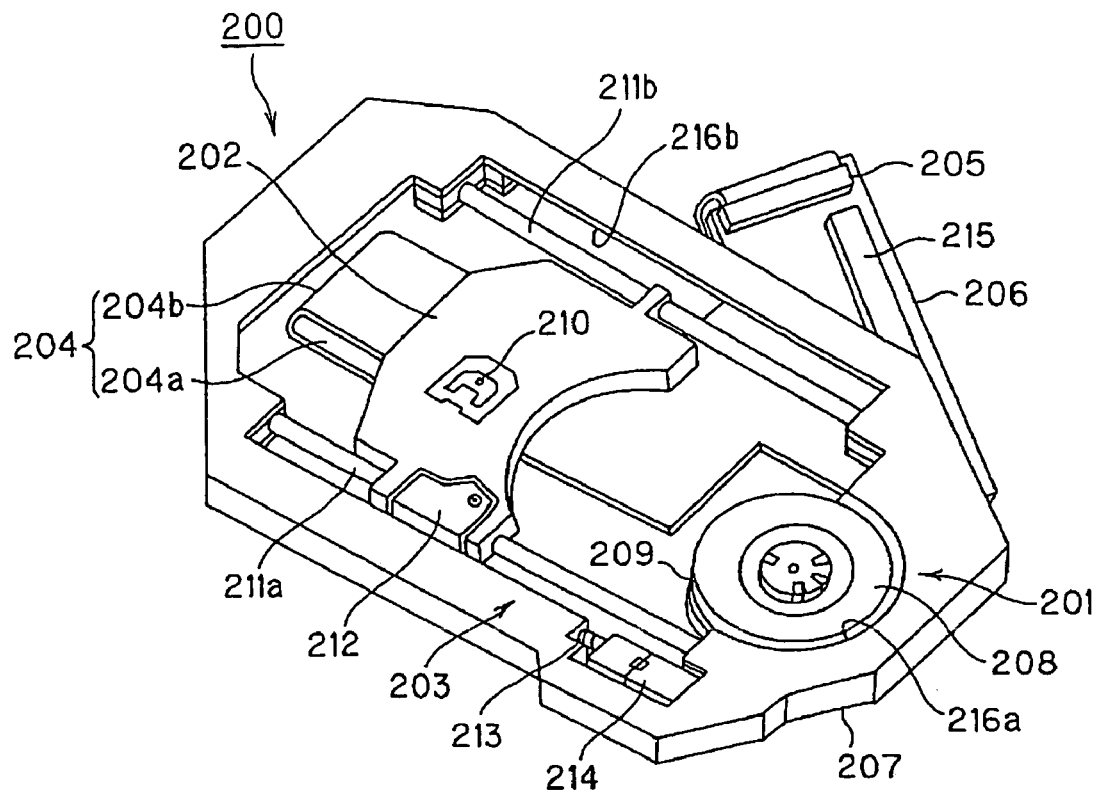
FIG. 1 is a perspective view showing a conventional disk drive unit.
Figure 2:
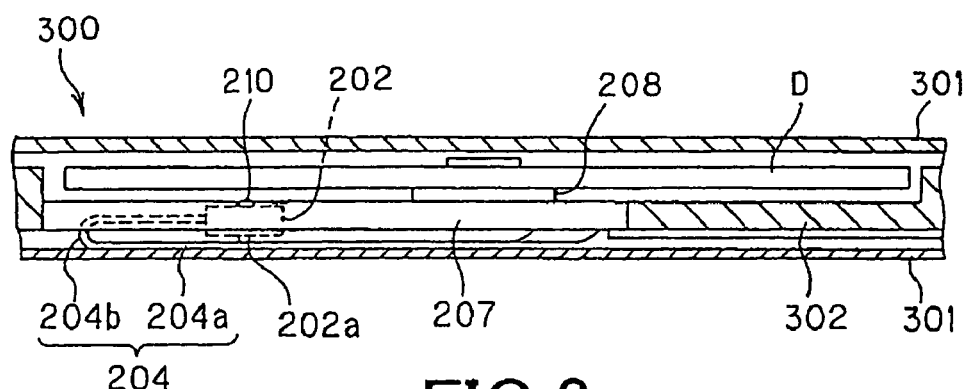
FIG. 2 is a side cross sectional view showing a disk drive apparatus within which the disk drive unit shown in FIG. 1 is mounted.
Figure 3:
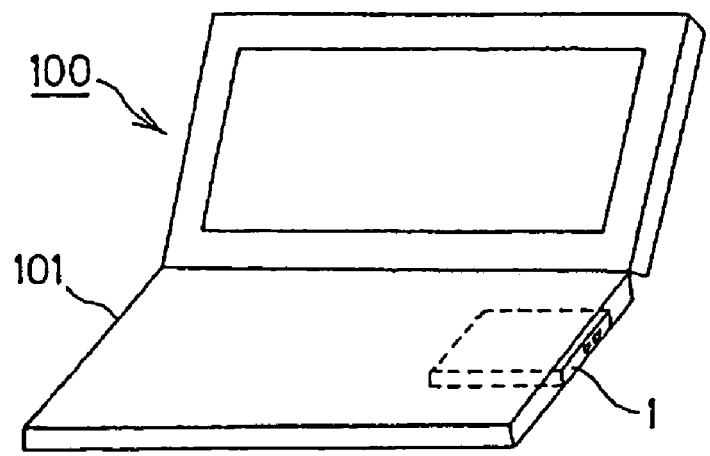
FIG. 3 is a perspective view showing a note-type personal computer within which the disk drive apparatus to which the present invention is applied is mounted.
Figure 4:
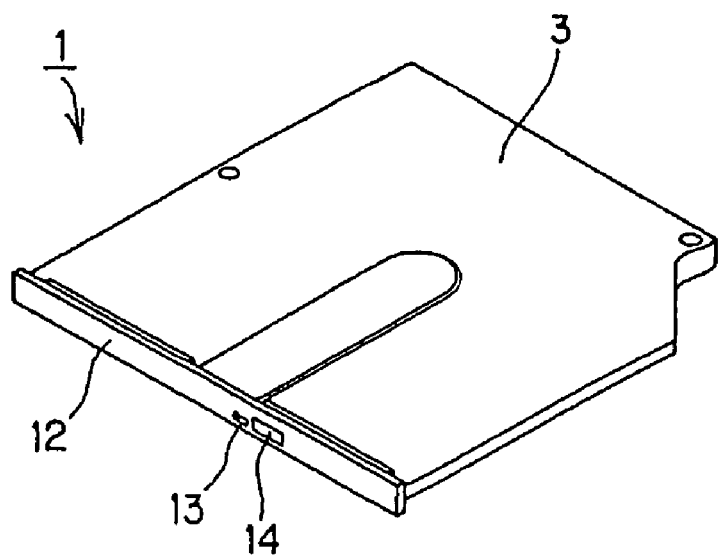
FIG. 4 is a perspective view showing the state where disk tray of the disk drive apparatus is accommodated.

As shown in FIGS. 3 and 4, the disk drive apparatus 1 to which the present invention is applied is adapted so that it is mounted at an equipment body 101 of a note-type personal computer, for example, to perform recording or reproduction of information signals with respect to an optical disk 2 such as CD (Compact Disk) or DVD (Digital Versatile Disk), and is caused to be of thin structure to such a degree that its thickness is substantially the same thickness of Hard Disk Drive (HDD) unit, for example. In concrete terms, its thickness is caused to be equal to approximately 9.5 mm.

Figure 5:
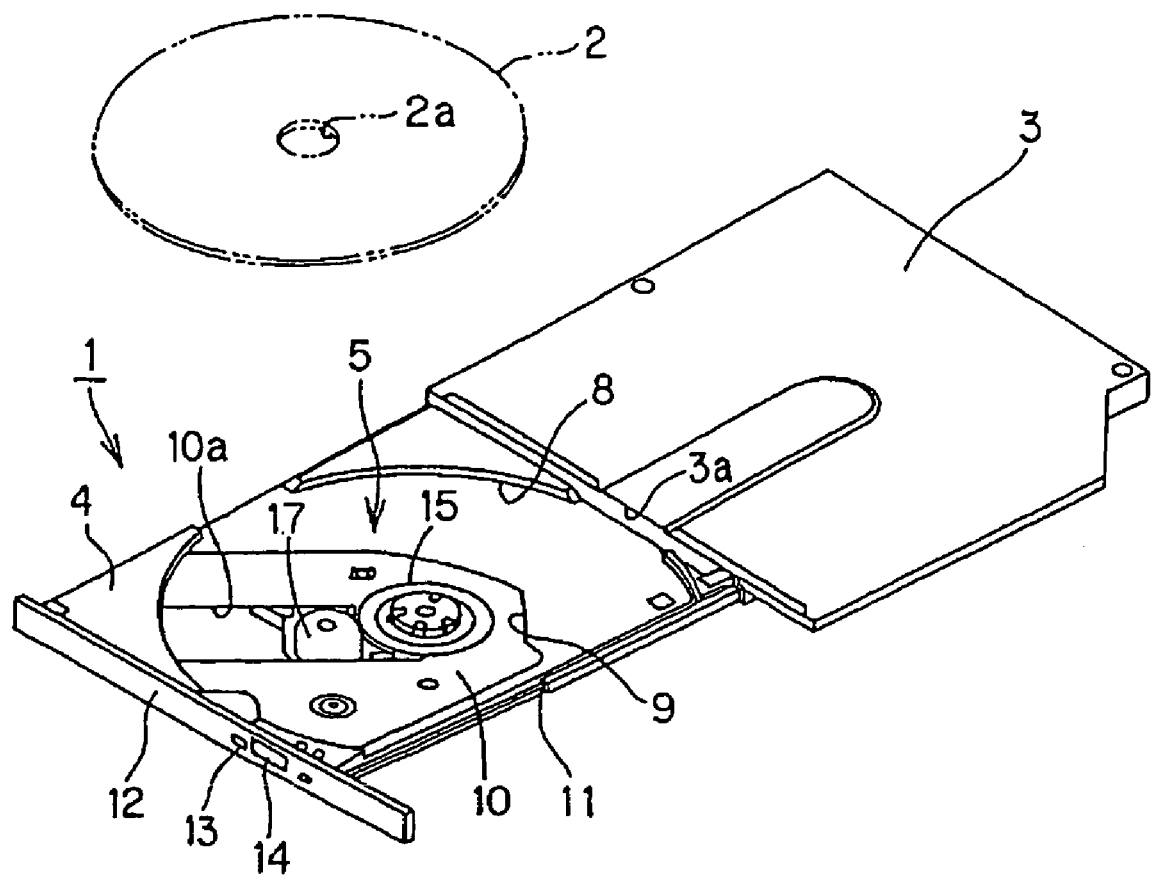
FIG. 5 is a perspective view showing the state where the disk tray of the disk drive apparatus is drawn or pulled out.
Figure 6:
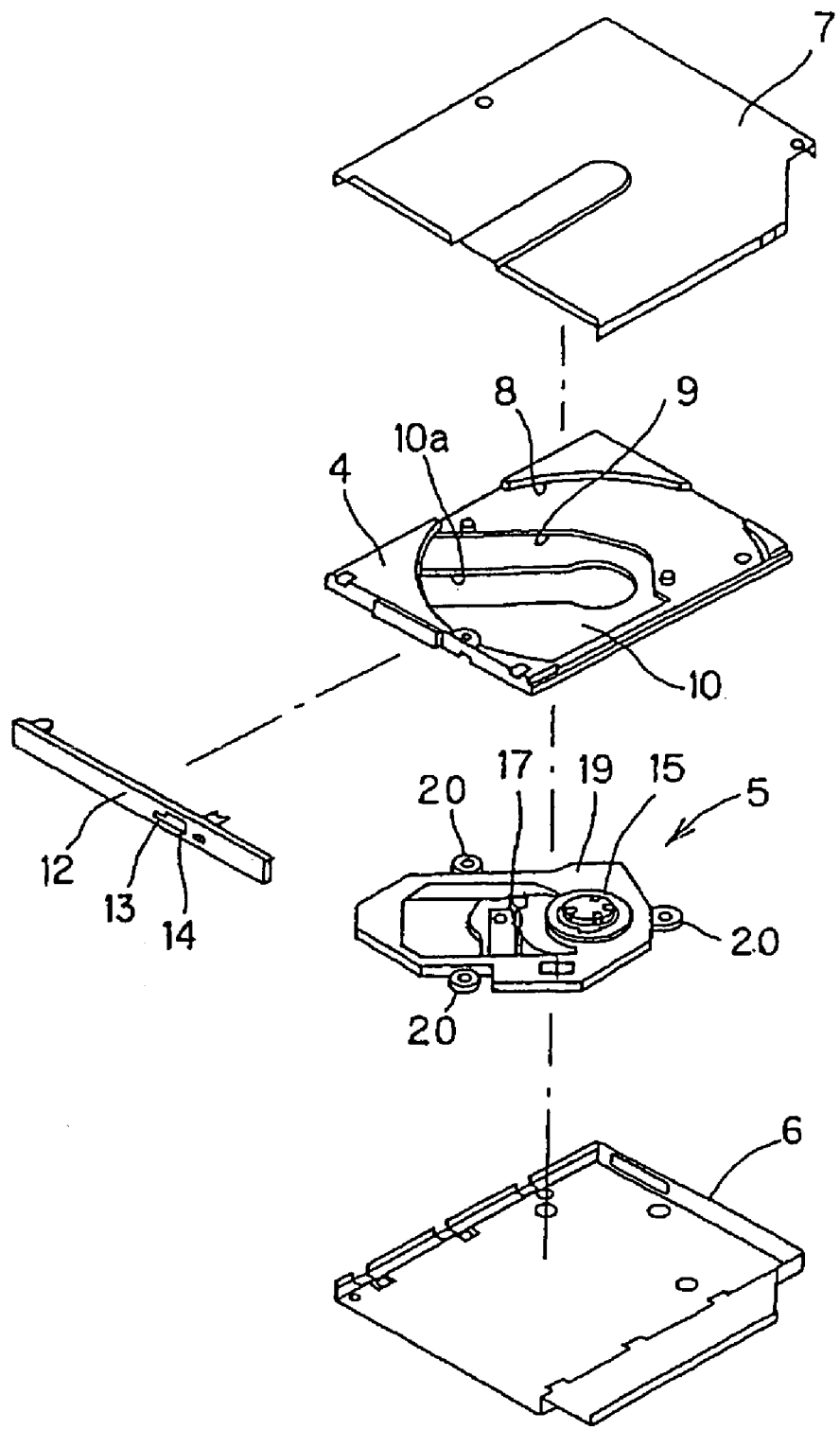
FIG. 6 is an exploded perspective view showing disk drive apparatus.

In concrete terms, as shown in FIGS. 5 and 6, the disk drive apparatus 1 comprises a casing (housing) 3, a disk tray 4 which is taking in and out in a horizontal direction from a tray doorway 3a provided at the front face of the casing 3, and a disk drive unit 5 attached to the disk tray 4.

The casing 3 has the structure in which, at a lower case (casing) 6 comprised of sheet metal so that the entirety thereof is formed so as to take substantially flat box-shape, a top plate 7 similarly comprised of sheet metal is attached by screw-fitting so as to close the upper opening portion thereof. Within the casing 3, accommodating space for accommodating the disk tray 4 is formed. The front face thereof is opened as the tray doorway 3a.

The disk tray 4 consists of resin molded material in which the entirety thereof is formed so as to have substantially rectangular flat shape. A recessed portion 8 having shape corresponding to the optical disk 2 is provided at the upper surface portion thereof. At the bottom surface portion of the recessed portion 8, an opening portion 9 for facing a disk drive unit 5 attached to the lower surface of the disk tray 4 toward the upper direction is formed at the bottom surface portion of the recessed portion 8. Moreover, at the disk drive unit 5 faced toward the upper direction from the opening portion 9, there is attached a decorative laminated plate or sheet 10 for covering the opening portion 9. At the decorative laminated plate 10, there is formed an opening portion 10a corresponding to opening portions 22a, 22b for facing a turn table 15a of the disk drive unit 5 and an object lens 17a of an optical pick-up 17 which will be described later toward the upper direction.

The disk tray 4 is slidably supported, by a guide rail mechanism 11 intervening between both side surfaces thereof and the inside surface of the lower case 6, between the accommodating position shown in FIG. 4 where the disk tray 4 is drawn or pulled into the casing 3 from the tray doorway 3a and draw-out position shown in FIG. 5 where the disk tray 4 is taken or drawn out toward the external of the casing 3 from the tray doorway 3a.

At the front face of the disk tray 4, there is attached a substantially rectangular plate-shaped front panel 12 for opening/closing the tray doorway 3a of the casing 3. Moreover, at the front surface of the front panel 12, there are provided a display unit 13 for performing lighting display of access state with respect to the optical disk 2, and an eject button 14 pushed down in ejecting the disk tray 4.

In this example, slide operation toward the front surface side of the disk tray 4 is held by lock mechanism (not shown) when it is accommodated into the casing 3. Further, when the eject button 14 is pushed down from this state, the holding state by the lock mechanism is released so that the disk tray 4 is pushed or thrust out from the tray doorway 3a toward the front surface side. Thus, the disk tray 4 is placed in the state where it can be taken or drawn out from the tray doorway 3a toward the take or draw-out position. On the other hand, the disk tray 4 is pushed into the accommodating position of the casing 3 so that slide operation toward the front surface side by the lock mechanism is held for a second time.

Figure 7:
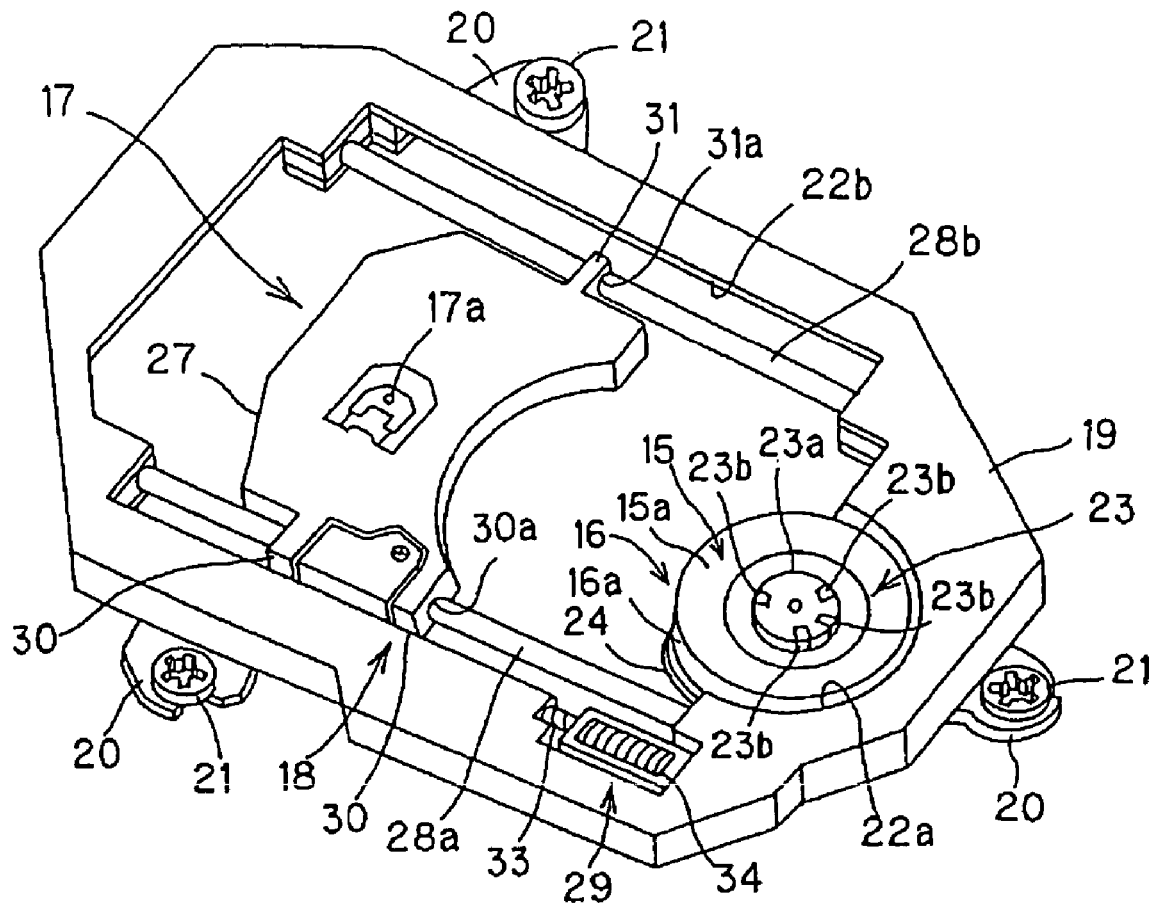
FIG. 7 is a perspective view when the disk drive unit is viewed from the upper surface side thereof.
Figure 8:
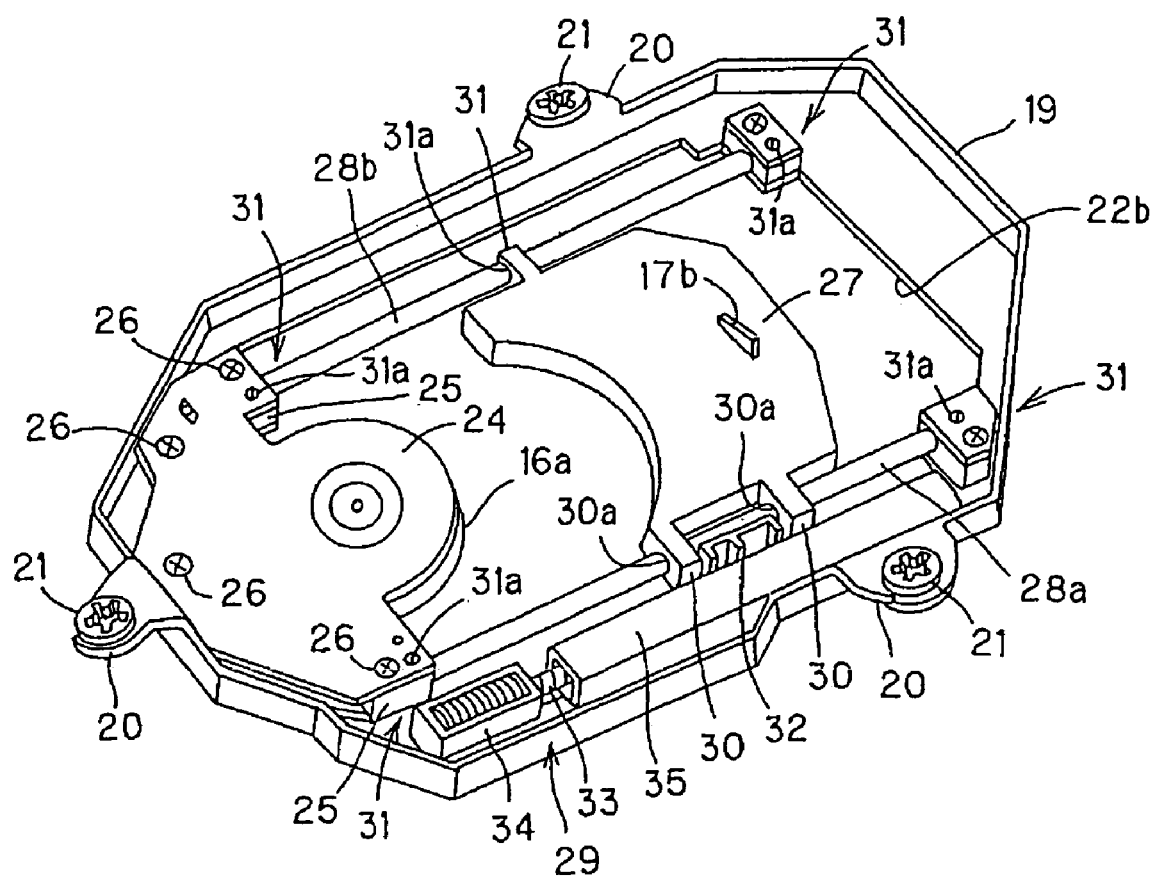
FIG. 8 is a perspective view when the disk drive unit is viewed from the bottom surface side thereof.

As shown in FIGS. 7 and 8, the disk drive unit 5 has very thin structure in which it comprises a disk loading portion 15 adapted so that the optical disk 2 is loaded, a disk rotation drive mechanism 16 for rotationally driving the optical disk 2 which has been loaded at the disk loading portion 15, an optical pick-up 17 for performing write or read operation of signals with respect to the optical disk 2 rotationally driven by the disk rotation drive mechanism 16, and a pick-up feed mechanism 18 for performing feed operation of the optical pick-up 17 in a radial direction of the optical disk 2, and these components are attached on the lower surface of the base 19.

The base 19 is formed by punching sheet metal so as to have a predetermined shape to slightly bend the periphery thereof downwardly. Moreover, three insulator attachment portions 20 are bent and formed toward the outside from the end edge portion of the base 19 bent downwardly. Insulators 21 each comprised of elastic member such as rubber, etc. for absorbing vibration, etc. are attached at respective insulator attachment portions 20. The base 19 is fixed and supported on the lower surface of the disk tray 4 through these insulators 21. Further, at the principal surface of the base 19, there are continuously formed a substantially semi-circular opening portion 22a for table for facing turn table 15a which will be described later toward the upper direction, and a substantially rectangular opening portion 22b for pick-up for facing the object lens 17a of the optical pick-up 17 toward the upper direction.

The disk loading portion 15 includes a turn table 15a rotationally driven by the disk rotation drive mechanism 16, wherein a chucking mechanism 23 for loading the optical disk 2 is provided at the central portion of the turn table 15a. The chucking mechanism 23 includes an engagement projected portion 23a engaged with center hole 2a of the optical disk 2, and plural holding hooks 23b for holding the periphery of the center hole 2a of the optical disk 2 which has been engaged with the engagement projected portion 23a, and serves to hold the optical disk 2 onto the turn table 15a while performing centering of the optical disk 2 which has been loaded on the turn table 15a.

The disk rotation drive mechanism 16 includes a flat spindle motor 16a at which the turn table 15a for holding the optical disk 2 is integrally provided on the upper surface thereof, and serves to rotationally drive the optical disk 2 by the spindle motor 16a in one body with the turn table 15a. Moreover, the spindle motor 16a is supported by a circuit wiring board 24. The circuit wiring board 24 is attached to the lower surface of the base 19 through a spacer member 25 by means of plural screws 26 in such a manner that the turn table 15a is slightly projected relative to the upper surface of the base 22 from the table opening portion 22a of the base 19.

The optical pick-up 17 serves to converge light beams which have been emitted from semiconductor laser serving as light source by the object lens 17a to irradiate the light beams thus converged onto the signal recording surface of the optical disk 2 to detect, by light receiving element, return light beams which have been reflected on the signal recording surface of the optical disk 2 to thereby perform write or read operation of signals with respect to the optical disk 2.

Moreover, the optical pick-up 17 comprises biaxial actuator (not shown) for allowing the object lens 17a to undergo displacement drive in a focusing direction of the direction in parallel to the optical axis of the object lens 17a and in a tracking direction of the direction perpendicular to the optical axis direction of the object lens 17a. The optical pick-up 17 serves to drive the biaxial actuator on the basis of focus error signal and tracking error signal which are obtained by detecting return light from the optical disk 2 by light receiving element to perform focus servo for allowing focal point of the object lens 17a to be positioned or placed on the signal recording surface of the optical disk 2 and tracking servo for following light beams converged by the object lens 17a with respect to recording tracks while performing displacement of the object lens 17a in the focusing direction and in the tracking direction.

The pick-up feed mechanism 18 comprises a pick-up base 27 on which respective components of the optical pick-up 17 are mounted, a pair of guide shafts 28a, 28b for slidably supporting the pick-up base 27 in a radial direction of the optical disk 2, and a displacement drive mechanism 29 for allowing the pick-up base 27 supported by these pair of guide shafts 28a, 28b to undergo displacement drive in the radial direction of the optical disk 2.

At the pick-up base 27, there are formed, in a projected manner, from side surfaces opposite to each other, a pair of guide pieces 30 where a guide hole 30a through which one guide shaft 28a among the pair of guide shafts 28a, 28b is penetrated, and a guide piece 31 where a guide groove 31a for holding or putting the other guide shaft 28b therebetween is formed. Thus, the pick-up base 27 is slidably supported by the pair of guide shafts 28a, 28b.

The pair of guide shafts 28a, 28b are disposed in such a manner that they are caused to be in parallel to each other with respect to the radial direction of the optical disk 2 in the state positioned at the lower surface of the base 19, and serves to guide the pick-up base 27 faced to the pick-up opening portion 22b of the base 19 over inner and outer circumferences of the optical disk 2. Both end portions of these pair of guide shafts 28a, 28b are respectively attached through a skew adjustment mechanism 31 at the lower surface of the base 19.

The skew adjustment mechanism 31 movably supports both end portions of the pair of guide shafts 28a, 29b in a direction perpendicular to the plane of the base 19, and permits adjustment of inclinations of respective guide shafts 28a, 28b so that light beams converged by the object lens 17a of the optical pick-up 17 are irradiated perpendicularly to the signal recording surface of the optical disk 2 while adjusting the position where end portions of respective guide shafts 28a, 28b are supported by an adjustment screw 31a. In addition, the distance between the optical pick-up 17 and the signal recording surface of the optical disk 2 held by the turn table 15a can be also adjusted.

Figure 9:
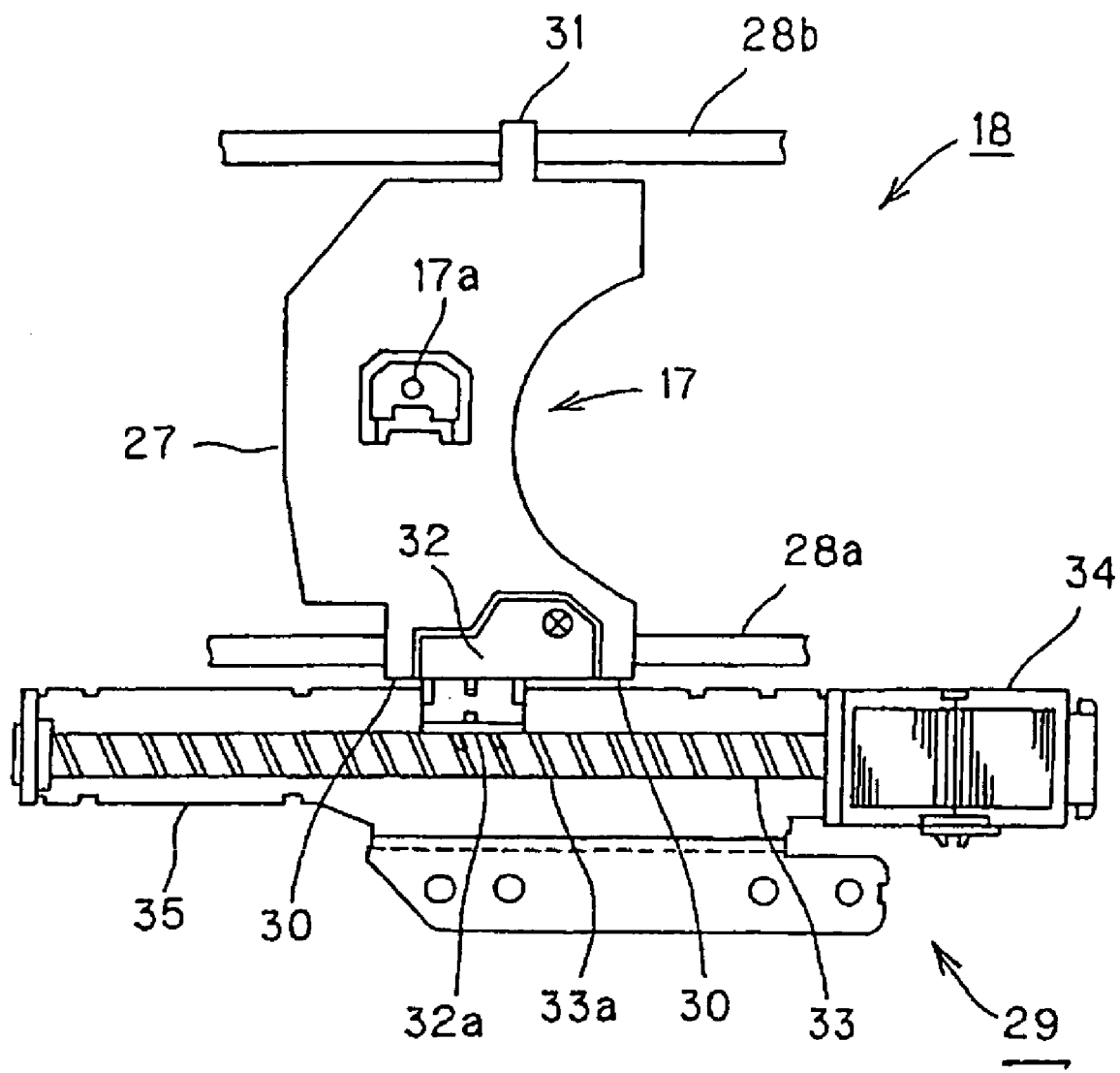
FIG. 9 is a plan view showing the configuration of pick-up feed mechanism.

The displacement drive mechanism 29 includes, as shown in FIG. 9, a rack mechanism 32 attached to the pick-up base 27, a feed screw 33 meshed with the rack member 32, and a drive motor 34 for rotationally driving the feed screw 33.

The rack member 32 is attached, at the base end side thereof, by screw-fitting in the state positioned between a pair of guide pieces 30 of the pick-up base 27, and a rack portion 32a meshed with the feed screw 33 disposed in parallel to one guide shaft 28a is integrally formed at the front end side thereof. The feed screw 33 is formed integrally with the drive shaft of the drive motor 34, and a spiral lead screw 33a with which the rack portion 32a of the rack member 32 is meshed is formed at the outer circumferential surface thereof. A stepping motor is used as the drive motor 34 to rotationally drive the feed screw 33 in accordance with drive pulse. Moreover, the feed screw 33 and the drive motor 34 are supported at a bracket 35 attached by screw-fitting at the lower surface of the base 19. The bracket 35 has a shape in which both end portions of elongated sheet metal are bent perpendicularly in the same direction. The drive motor 34 is fixed at the bent one end side thereof in the state where the feed screw 33 is penetrated therethrough, and the front end of the feed screw 33 is axially supported by axial hole provided at the other end thereof to thereby rotatably support the feed screw 33.

At the displacement drive mechanism 29, the drive motor 34 performs displacement of the rack member 32 in axial direction of the feed screw 33 by meshing between the lead screw 33a and the rack portion 32a while the drive motor 34 rotationally drives the feed screw 33 to thereby perform displacement drive of the pick-up base 27 supported by the pair of guide shafts 28a, 28b in the radial direction of the optical disk 2.

In the disk drive apparatus 1 constituted as described above, when instruction of recording or reproduction is sent from the personal computer 100 in the state where the disk tray 4 for holding the optical disk 2 is accommodated within the casing 3, recording or reproduction of information signals with respect to the optical disk 2 is performed on the basis of this command. In concrete terms, at the disk drive unit 5, the disk rotation drive mechanism 15 rotationally drives the optical disk 2, and the optical pick-up 17 performs write or read operation of signals with respect to the optical disk 2 while the pick-up feed mechanism 18 is performing feed operation of the optical pick-up 17 in the radial direction of the optical disk 2.

Figure 10:
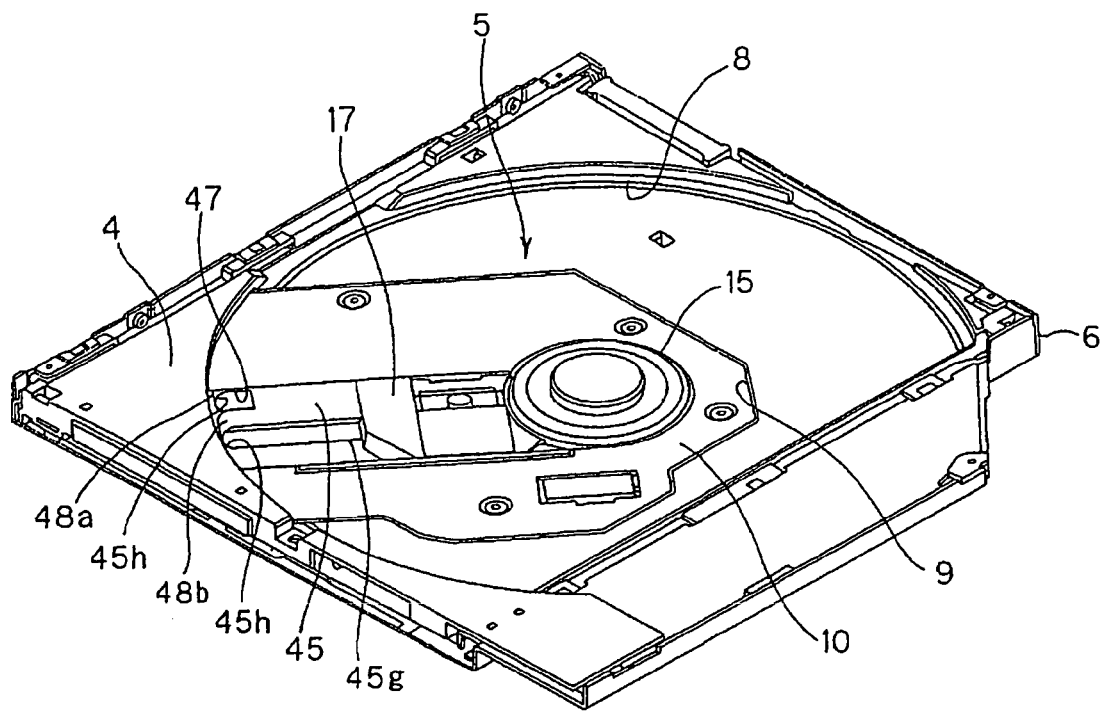
FIG. 10 is a perspective view showing the state where top plate of the disk drive apparatus is detached.
Figure 11:
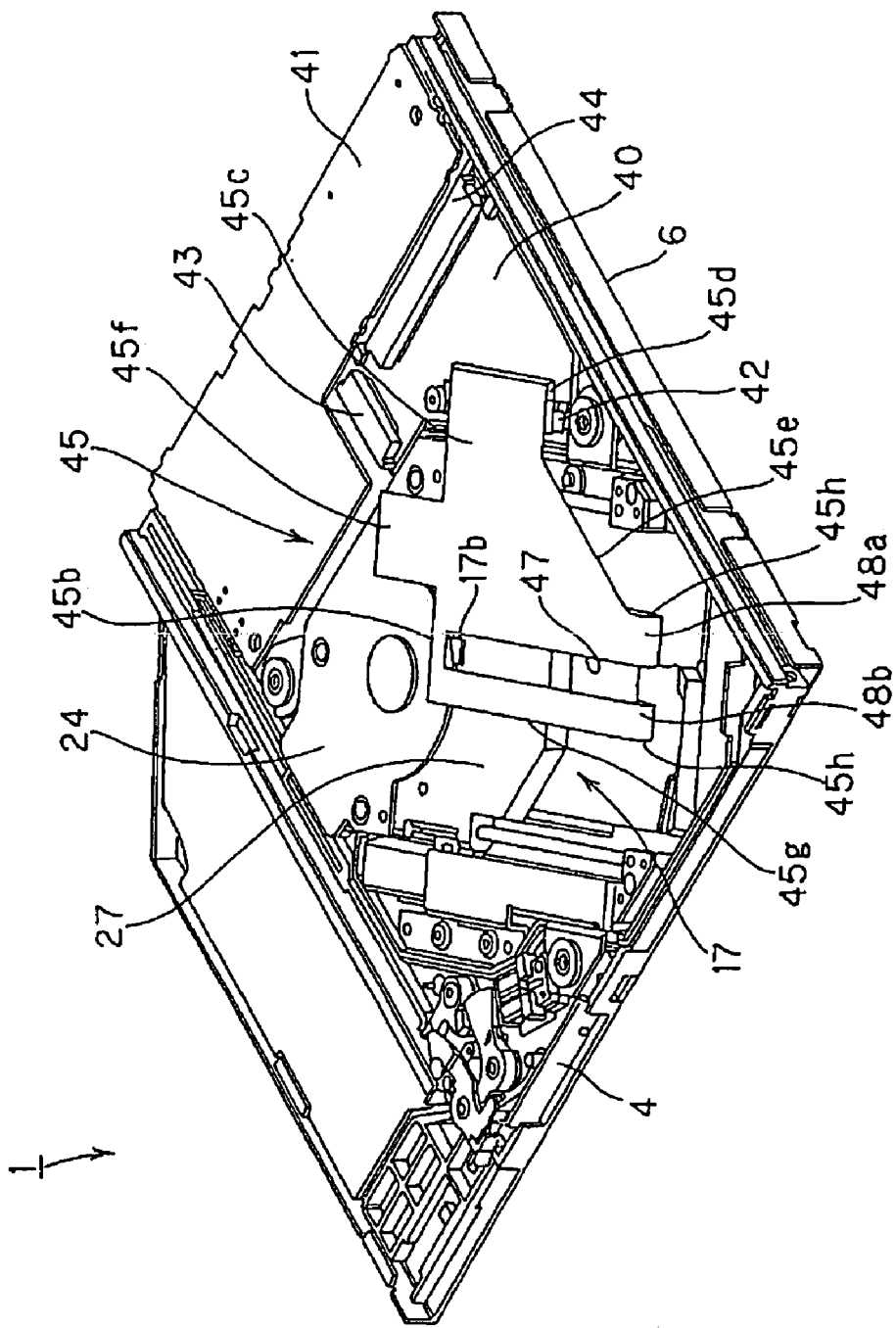
FIG. 11 is a perspective view showing the state where top plate of the disk drive apparatus is detached.

Meanwhile, the disk drive apparatus 1 comprises, as shown in FIGS. 10 and 11, a circuit wiring board 40 of the tray side attached to the bottom surface portion of the disk tray 4, and a circuit wiring board 41 of the drive body side attached to the bottom surface portion of the lower case 6.

Among them, at the circuit wiring board 40 of the tray side, there are provided a connector 42 for performing electric connection between the circuit wiring board 40 and the optical pick-up 17, a connector 43 for performing electric connection between the circuit wiring board 40 and the circuit wiring board 24 of the unit side, and a connector 44 for performing electric connection between the circuit wiring board 40 and the circuit wiring board 41 of the drive body side. Moreover, drive control circuits for performing drive control operations of respective components of the spindle motor 16a, the drive motor 34 and the optical pick-up 17 which have been described above, etc. are provided on both principal surfaces of the circuit wiring board 40.

On the other hand, at the circuit wiring board 41 of the drive body side, although illustration is omitted, there are provided a connector for performing electric connection to the circuit wiring board 40 of the tray side, and a connector for performing electric connection to the apparatus body 101. Moreover, drive control circuits for performing drive control operations of respective units (components) of the drive body, etc. are provided on both principal surfaces of the circuit wiring board 41.

Figure 16:
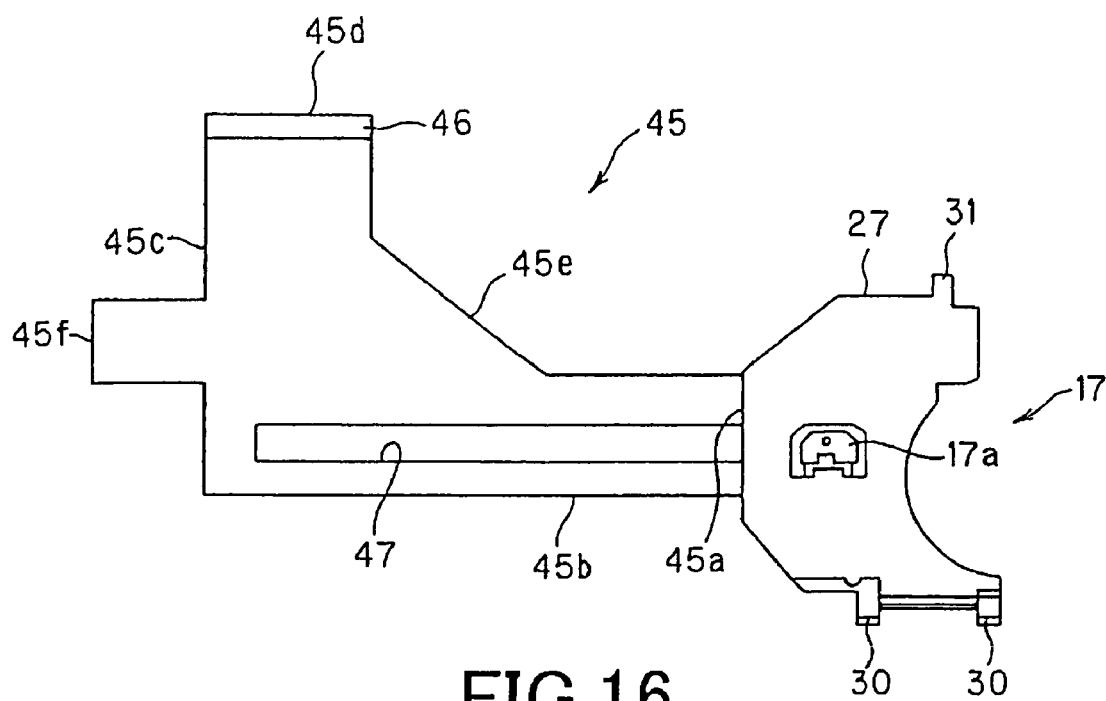
FIG. 16 is a plan view showing another configuration example of FPC attached to the optical pick-up.

In this example, with respect to the circuit wiring board 24 of the unit side attached to the above-described base 19, drive control circuits for performing drive control operations of respective units (components) of the spindle motor 16a, the drive motor 34 and the optical pick-up 17, etc. are mounted on the circuit wiring board 40 of the tray side and the circuit wiring board 41 of the drive body side so that miniaturization thereof can be realized to much degree as compared to the above-described conventional circuit wiring board 206 shown in FIG. 16. Thus; further miniaturization and lighting in weight of the above-described disk drive unit 5 can be made.

Further, between the circuit wiring board 40 of the tray side and the optical pick-up 17, between the circuit wiring board 40 of the tray side and the circuit wiring board 24 of the unit side, and between the circuit wiring board 40 of the tray side and the circuit wiring board 41 of the drive body side, there are drawn around flexible printed wiring boards (hereinafter referred to as FPC) for electrically connecting between respective connectors.

Figure 12:
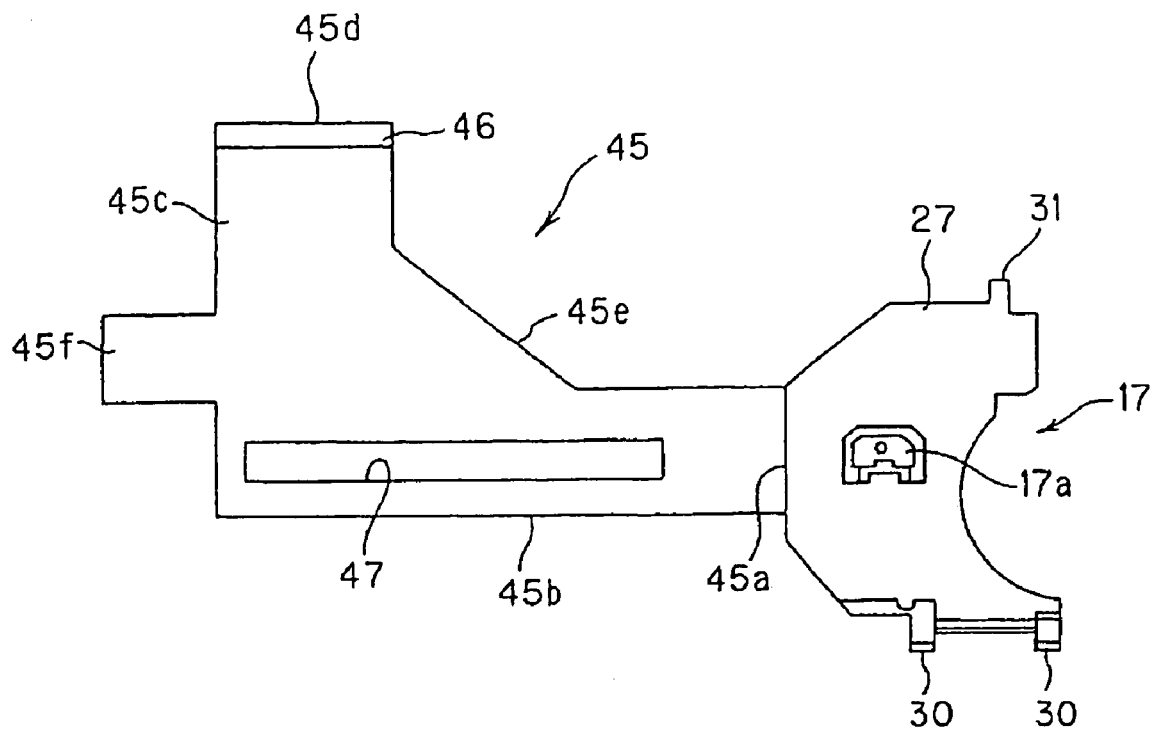
FIG. 12 is a plan view showing the configuration of FPC attached to optical pick-up.

Meanwhile, a FPC 45 for electrically connecting between the optical pick-up 17 and the circuit wiring board 40 of the tray side has a shape as shown in FIG. 12, for example.

In concrete terms, one end portion 45*a* of the FPC 45 is connected to the side surface of the outer circumferential side of the optical pick-up 17. In this example, the FPC 45 has the structure in which one end portion 45*a* thereof is branched into plural wiring portions, and semiconductor laser, light receiving element, liquid crystal for correction of aberration, and biaxial actuator, etc. which are mounted on the pick-up base 27 are directly connected to terminal portions provided at front ends of respective branched wiring portions.

From one end portion 45*a* of the FPC 45, a first extended portion 45*b* is provided in a manner extended in feed direction of the optical pick-up 17. In this example, the first extended portion 45*b* is a portion serving as a folded portion 45*g* and a bending displacement portion 45*h* of the FPC 45 which will be described later.

Moreover, from one side along feed direction of the optical pick-up 17 of the first extended portion 45*b*, a second extended portion 45*c* is provided in a manner extended in a direction perpendicular to feed direction of the optical pick-up 17. The second extended portion 45*c* is a portion for guiding the other end portion 45*d* of the FPC 45 toward the circuit board 40 of the tray side. Further, at the other end portion 45*d* of the FPC 45, there is provided a terminal portion 46 into which the connector 42 provided at the circuit wiring board 40 of the tray side is inserted.

In this example, between the first extended portion 45*b* and the second extended portion 45*c*, there is provided a taper portion 45*e* broad in width. Moreover, from one side positioned at the side opposite to the optical pick-up 17 of the second extended portion 45*c*, there is provided a third extended portion 45*f* extended in a feed direction of the optical pick-up 17. The third extended portion 45*f* is a portion adapted for allowing the FPC 45 folded back toward the back surface side of the optical pick-up 17 to be positioned at the further inside with respect to the innermost circumferential portion of the pick-up opening portion 22*b* when the optical pick-up 17 is positioned at the outermost circumferential portion of the pick-up opening portion 22*b*. Thus, it is prevented that the FPC 45 is pulled up toward the base 19 side through the pick-up opening portion 22*b* when feed operation of the optical pick-up 17 is performed.

Figure 13:
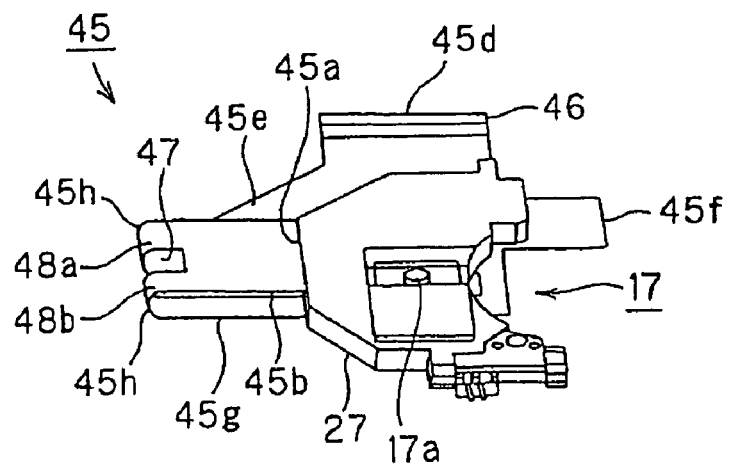
FIG. 13 is a perspective view when folded state of FPC attached to the optical pick-up is viewed from the upper surface side thereof.
Figure 14:
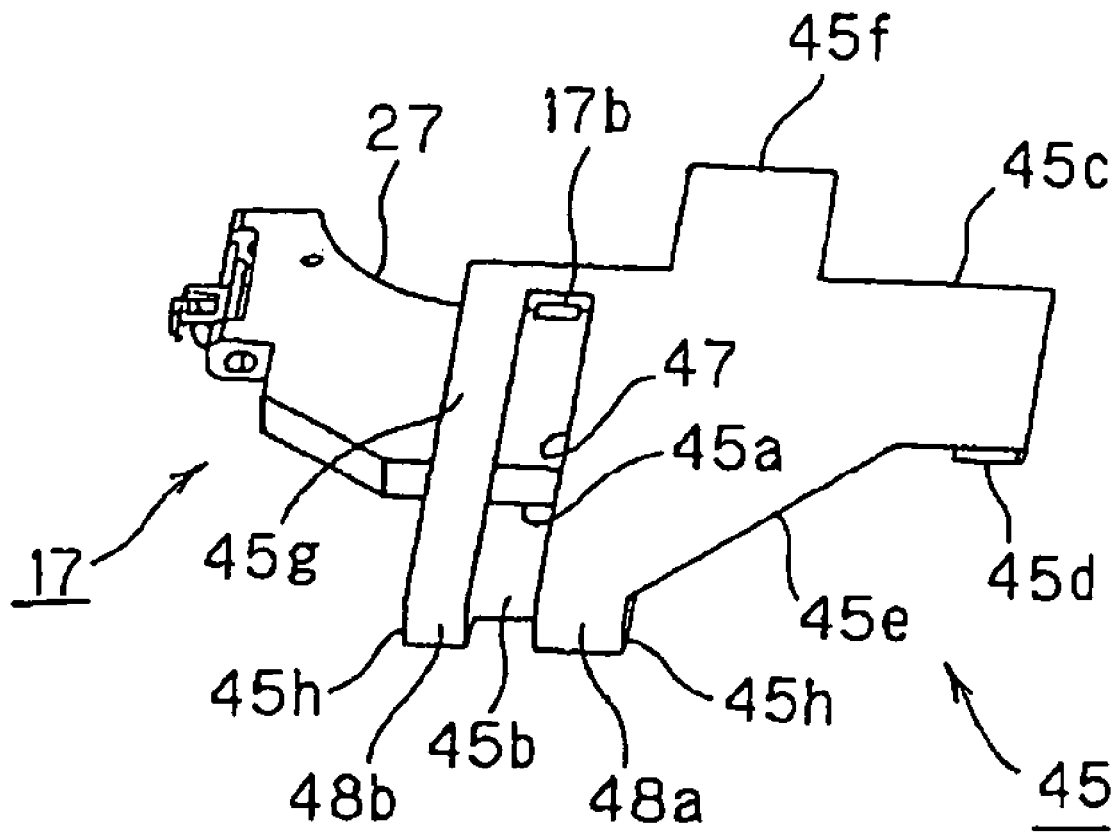
FIG. 14 is a perspective view when folded state of FPC attached to the optical pick-up is viewed from the bottom surface side thereof.

As shown in FIGS. 10 and 11, the FPC 45 is adapted so that a connecting portion 46 provided at the other end portion 45*d* is connected to the connector 42 provided on the circuit wiring board 40 of the tray side in the state where the first extended portion 45*b* is folded back toward the bottom surface portion side of the optical pick-up 17. Namely, as shown in FIGS. 13 and 14, when the FPC 45 is drawn around between the optical pick-up 17 and the circuit wiring board 40, it would include a folded portion 45*g* folded back toward the bottom surface portion side of the optical pick-up 17, and a bending displacement portion 45*h* for allowing folded position of the folded portion 45*g* to undergo displacement in a manner following feed operation of the optical pick-up 202.

Here, the liquid crystal device for correcting aberration mounted at the pick-up base 27 is disposed in a manner projected from the bottom surface portion of the pick-up base 27. Namely, a portion of the liquid crystal device forms a projected portion 17*b* projected from the bottom surface portion of the pick-up base 27.

In correspondence therewith, at the folded portion 45*g* of the FPC 45, there is formed a slit 47 for escaping the projected portion 17*b* projected from the bottom surface portion of the pick-up base 27. The slit 47 is an opening portion formed as the result of the fact that substantially the central portion of the folded portion 45*g* is cut in linear form over at least the region opposite to the bottom surface portion of the optical pick-up 17.

Thus, at the disk drive apparatus 1, in performing feed operation of the optical pick-up 17 in the radial direction of the optical disk 2, it is possible to avoid contact between the projected portion 17*b* projected from the bottom surface portion of the optical pick-up 17 and the folded portion 45*g* of the FPC 45. Accordingly, at the disk drive apparatus 1, the spacing between the bottom surface portion of the optical pick-up 17 and the lower case 6 is narrowed, thus permitting the entirety of the apparatus to be of further thin structure.

Figure 15:
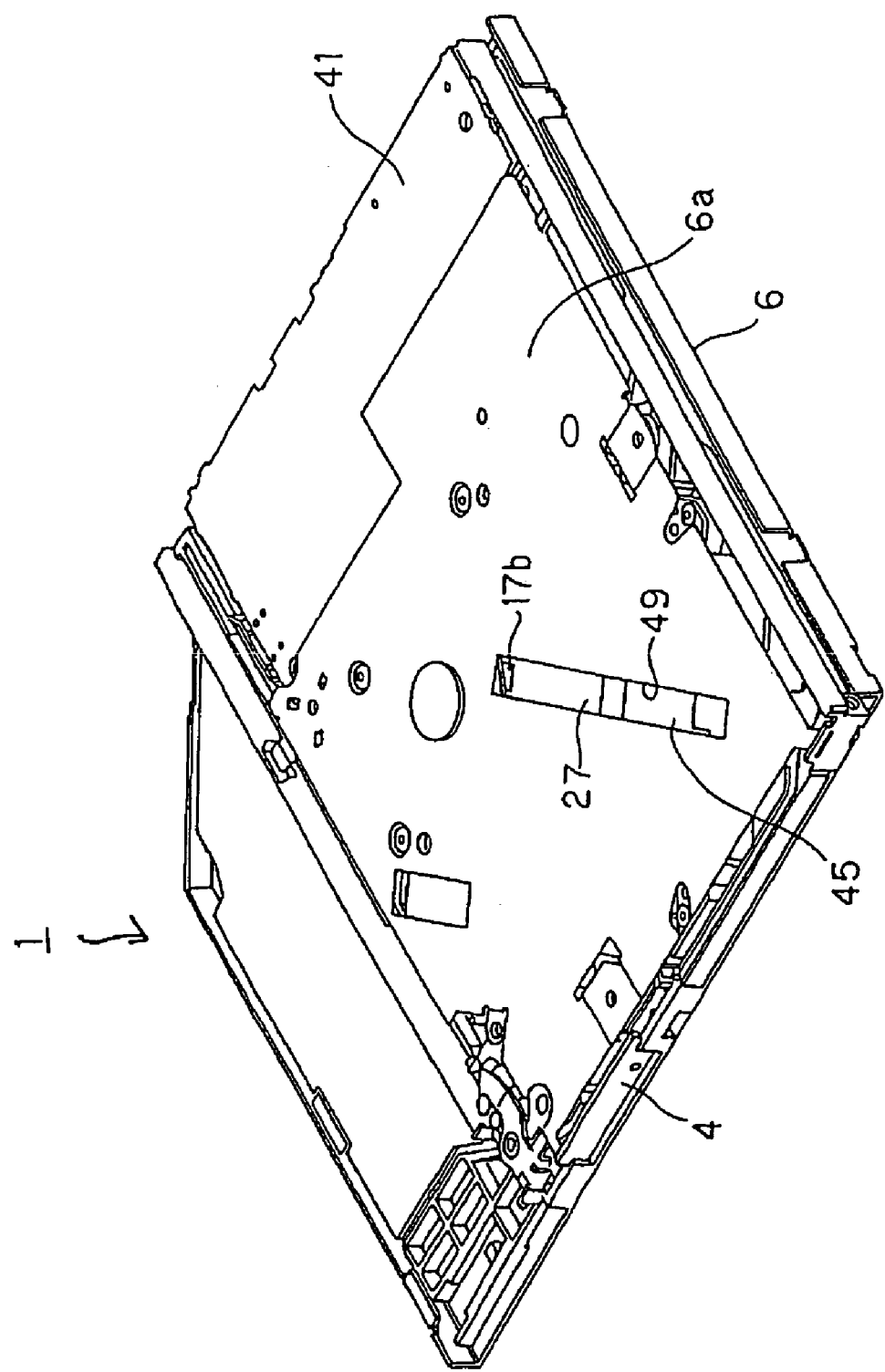
FIG. 15 is a perspective view when disk drive apparatus is viewed from the bottom surface side thereof.

Further, at the disk drive apparatus 1, as shown in FIG. 15, a slit 49 for escaping the projected portion 17*b* of the optical pick-up 17 may be provided at the bottom plate 6*a* constituting the bottom surface portion of the lower case 6. Thus, at the disk drive apparatus 1, the spacing between the bottom surface portion of the optical pick-up 17 and the lower case 6 is narrowed, thus also permitting the entirety of the apparatus to be of further thin structure.

Meanwhile, at the disk drive apparatus 1, when the spacing between the bottom surface portion of the optical pick-up 17 mounted at the disk drive unit 5 and the lower case 6 is narrowed, drawn-around space of the FPC 45 which is drawn around between the optical pick-up 17 and the circuit wiring board 40 also becomes narrow. In this case, at the bending displacement portion 45*h* corresponding to folded position of the FPC 45, since the radius of curvature becomes small, its elastic (spring) force is also increased.

Here, as the result of the fact that the above-described slit 47 is formed, the bending displacement portion 45*h* of the FPC 45 is divided into a pair of wiring portions 48*a*, 48*b* arranged in a direction substantially perpendicular to feed direction of the optical pick-up 17. These pair of wiring portions 48*a*, 48*b* are formed with substantially the same width in the state where the slit 47 is put therebetween so that elastic force produced by bending substantially becomes uniform.

Thus, at the disk drive apparatus 1, it is possible to reduce elastic force produced by bending of respective wiring portions 48*a*, 48*b* to lessen load applied to the optical pick-up 17 from the FPC 45. Accordingly, at the disk drive apparatus 1, even in the case where draw-around space of the FPC becomes narrow by realization of thin structure of the apparatus body, load applied to the optical pick-up 17 from the FPC 45 is lessened, thereby making it possible to suitably perform feed operation of the optical pick-up 17 by the pick-up feed mechanism 18 in the radial direction of the optical disk 2.

Particularly, at the disk drive apparatus 1, even in the case where the number of wirings of the FPC 45 is increased so that the FPC 45 becomes broad, the bending displacement portion 45*h* of the FPC 45 is divided into plural wiring portions 48*a*, 48*b* arranged in a direction substantially perpendicular to feed direction of the optical pick-up 17, thereby making it possible to lessen load applied to the optical pick-up 17 from the FPC 45.

Meanwhile, it is desirable that, among the pair of wiring portions 48*a*, 48*b* of the FPC 45, a first signal line for performing drive control of the optical pick-up 17 by a first recording format (e.g., CD format) is wired at the first wiring portion 48*a*, and a second signal line for performing drive control of the optical pick-up 17 by a second recording format (e.g., DVD format) different from the first recording format is wired at the second wiring portion 48b. Thus, it is possible to keep constant a distance between the first signal line and the second signal line to prevent occurrence of noise, etc. by interference of adjacent signal lines.

It is to be noted that it is not necessarily required that the FPC 45 has the above-described shape shown in FIG. 12. For example, as in the case of the FPC 45 shown in FIG. 16, the slit 47 may have a shape formed up to one end portion 45a of the FPC 45. In this case, a pair of wiring portions 48a, 48b are divided up to one end portion 45a of the FPC 45 in the state where the slit 47 is put therebetween.

Figure 17:
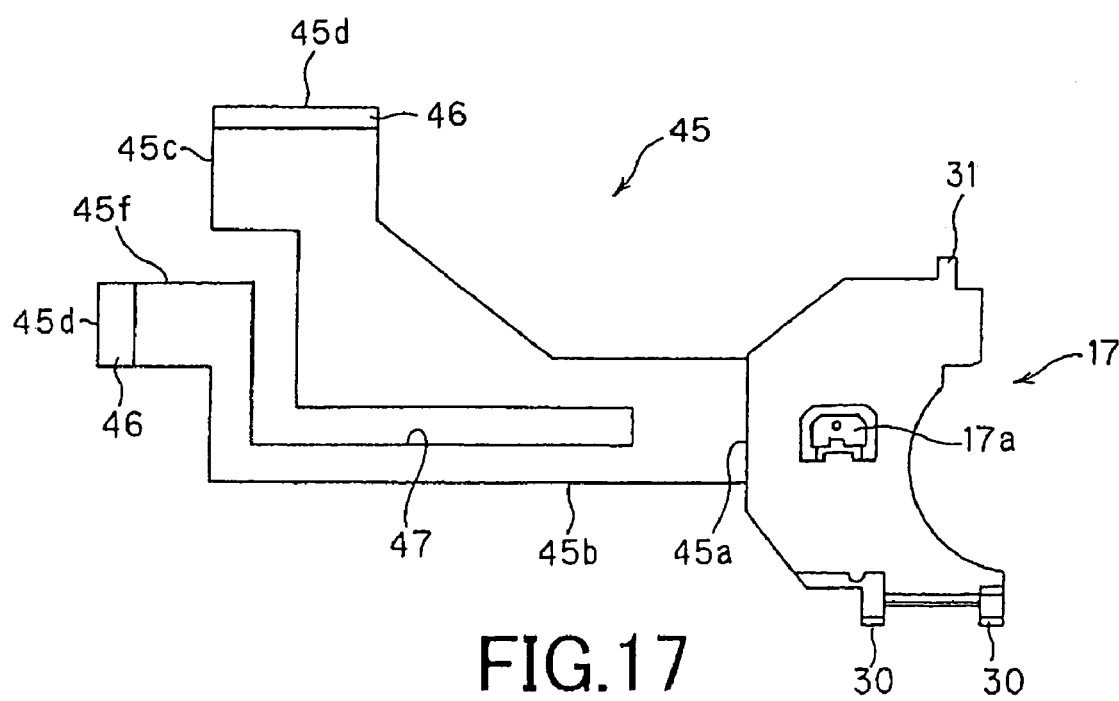
FIG. 17 is a plan view showing a further configuration example of FPC attached to the optical pick-up.

Moreover, as in the case of FPC 45 shown in FIG. 17, the slit 47 may also have a shape opened at the other end portion 45d of the FPC 45. In this case, the pair of wiring portions 48a, 48b are divided up to the other end portion 45d of the FPC 45.

Further, while there is employed the configuration in which the FPC 45 is provided in a manner extended along feed direction of the pick-up 17 from the outer circumferential side of the optical pickup 17, there may be also employed the configuration in which the FPC 45 is provided in a manner extended along feed direction of the optical pick-up 17 from the inner circumferential side of the optical pick-up 17.

Moreover, it is not limited that the FPC 45 has shape divided into a pair of wiring portions 48a, 48b, but the FPC 45 may also have a shape divided into three wiring portions or more depending upon circumstances. Further, an opening portion for realization of light weight, etc. may be provided at the FPC 45 in addition to the above-described slit 47.

It should be noted that the present invention can be applied to disk drive apparatuses for performing recording and/or reproduction of information signals with respect to optical disk such as magneto-optical disk, etc. and/or disk cartridge within which such optical disk is accommodated also except for the above-described optical disk 2.

In addition, the present invention is not limited to the above-described disk drive apparatus 1 of the tray type in which the disk drive unit 5 is attached to the disk tray 4, but can be also applied to a disk drive apparatus 1 of the slot-in type in which the optical disk is inserted into a disk insertion/withdrawal hole provided at the front surface of the casing or is withdrawn therefrom.

It is to be noted that while the invention has been described in accordance with certain preferred embodiments thereof illustrated in the accompanying drawings and described in the above description in detail, it should be understood by those ordinarily skilled in the art that the invention is not limited to the embodiments, but various modifications, alternative constructions or equivalents can be implemented without departing from the scope and spirit of the present invention as set forth and defined by the appended claims.

The invention claimed is:

1. An optical pick-up device comprising:
an optical pick-up operable to perform a feed operation in a radial direction of an optical disk, and performing write and/or read operations of signals with respect to the rotating optical disk; and
a flexible printed wiring board having one end portion connected to the optical pick-up, and the other end portion provided in a manner extended in a feed direction of the optical pick-up, the flexible printed wiring board including a folded portion folded back toward the bottom surface portion side of the optical pick-up, and a bending displacement portion for allowing folded position of the folded portion to undergo displacement in a manner following feed operation of the optical pick-up, an opening portion for escaping a projected portion projected from the bottom surface portion of the optical pick-up being provided at the folded portion,
wherein the flexible printed wiring board includes a pair of wiring portions divided in the state where the opening portion is put therebetween, the pair of wiring portions being formed so as to have substantially the same width;
wherein, among the pair of wiring portions, a first signal line for performing drive control of the optical pick-up by a first recording format is wired at the first wiring portion, and a second signal line for performing drive control of the optical pick-up by a second recording format different from the first recording format is wired at the second wiring portion.

2. The optical pick-up device as set forth in claim 1, wherein the opening portion is formed up to one end portion of the flexible printed wiring board.

3. The optical pick-up device as set forth in claim 1, wherein the opening portion is opened at the other end portion of the flexible printed wiring board.

4. A disk drive unit comprising:
a disk loading portion configured to load an optical disk;
a disk rotation drive mechanism configured to rotationally drive the optical disk been loaded at the disk loading portion;
an optical pick-up configured to perform write and/or read operations of signals with respect to the optical disk rotationally driven by the disk rotation drive mechanism,
a pick-up feed mechanism configured to allow the optical pick-up to undergo feed operation thereof in a radial direction of the optical disk; and
a flexible printed wiring board having one end portion connected to the optical pick-up, and the other end portion provided in a manner extended in a feed direction of the optical pick-up, the flexible printed wiring board including a folded portion folded back toward the bottom surface portion side of the optical pick-up, and a bending displacement portion for allowing folded position of the folded portion to undergo displacement in a manner following feed operation of the optical pick-up by the pick-up feed mechanism, the bending displacement portion being divided into plural wiring portions arranged in a direction substantially perpendicular to feed direction of the optical pick-up,
wherein, among the plural wiring portions, a first signal line for performing drive control of the optical pick-up by a first recording format is wired at the first wiring portion, and a second signal line for performing drive control of the optical pick-up by a second recording format different from the first recording format is wired at the second wiring portion.

5. The disk drive unit as set forth in claim 4, wherein the plural wiring portions are formed so as to have substantially the same width.

6. The disk drive unit as set forth in claim 4, wherein the plural wiring portions are divided up to one end portion of the flexible printed wiring board.

7. The disk drive unit as set forth in claim 4, wherein the plural wiring portions are divided up to the other end portion of the flexible printed wiring board.

8. A disk drive apparatus comprising:
a casing; and
a disk drive unit accommodated within the casing,
the disk drive unit including,
a disk loading portion configured to load an optical disk is loaded, a disk rotation drive mechanism configured to rotationally drive the optical disk which has been loaded at the disk loading portion, an optical pick-up configured to perform write and/or read operations of signals with respect to the optical disk rotationally driven by the disk rotation drive mechanism, a pick-up feed mechanism configured to allow the optical pick-up to undergo feed operation thereof in a radial direction of the optical disk, and a flexible printed wiring board having one end portion connected to the optical pick-up, and the other end portion provided in a manner extended in a feed direction of the optical pick-up, the flexible printed wiring board including a folded portion folded back toward the bottom surface portion side of the optical pick-up, and a bending displacement portion for allowing folded position of the folded portion to undergo displacement in a manner following the feed operation of the optical pick-up by the pick-up feed mechanism, an opening portion for escaping a projected portion projected from the bottom surface portion of the optical pick-up being provided at the folded portion, wherein, among the pair of wiring portions, a first signal line for performing drive control of the optical pick-up by a first recording format is wired at the first wiring portion, and a second signal line for performing drive control of the optical pick-up by a second recording format different from the first recording format is wired at the second wiring portion.

9. The disk drive apparatus as set forth in claim 8, wherein the flexible printed wiring board includes a pair of wiring portions divided in the state where the opening portion is put therebetween, the pair of wiring portions being formed so as to have substantially the same width.

10. The disk drive apparatus as set forth in claim 8, wherein the opening portion is formed up to one end portion of the flexible printed wiring board.

11. The disk drive apparatus as set forth in claim 8, wherein the opening portion is opened at the other end portion of the flexible printed wiring board.

12. The disk drive apparatus as set forth in claim 8, wherein an opening portion for escaping a projected portion of the optical pick-up is provided at the bottom surface portion of the casing.

13. The disk drive apparatus as set forth in claim 8, comprising:

a circuit wiring board disposed at the bottom surface portion of the casing, and adapted so that a connector to which the other end portion of the flexible printed wiring board is connected is provided.

* * * * *